United States Patent [19]

Chu

[11] 4,454,217

[45] Jun. 12, 1984

[54] OPAQUE IMAGE FORMATION IN TONED PHOTOPOLYMER LAYERS USING LEACHING SOLUTION

[76] Inventor: Victor F. Chu, 2502 Garth Rd., Wilmington, Del. 19810

[21] Appl. No.: 433,413

[22] Filed: Oct. 8, 1982

[51] Int. Cl.³ .................... G03C 11/12; G03C 5/00; G03C 3/00
[52] U.S. Cl. .................... 430/253; 430/252; 430/258; 430/290; 430/291; 430/330; 430/331
[58] Field of Search ............... 430/290, 291, 331, 253, 430/252, 258, 330

[56] References Cited

U.S. PATENT DOCUMENTS

| | | | |
|---|---|---|---|
| 3,561,962 | 2/1971 | Ewing | 430/290 |
| 3,594,535 | 7/1971 | Chu et al. | 430/260 |
| 3,649,268 | 3/1972 | Chu et al. | 430/365 |
| 3,723,124 | 3/1973 | Jones et al. | 96/48 |
| 4,198,236 | 4/1980 | Held | 430/306 |

*Primary Examiner*—Richard L. Schilling

[57] ABSTRACT

Process for formation of white opaque image in the toned areas of a photopolymer composition which comprises a leachable monomer, photoinitiator, organic polymer binder and optionally a plasticizer wherein the toned image areas are treated with a leaching solution, e.g., mixtures of organic solvents or mixtures of water and organic solvents; washing the treated areas, e.g., with water; and drying at a temperature up to 70° C., e.g., with hot air dryer. The process is useful for the preparation of overlay exhibits and direct positive image for microfilm.

9 Claims, No Drawings

OPAQUE IMAGE FORMATION IN TONED PHOTOPOLYMER LAYERS USING LEACHING SOLUTION

DESCRIPTION

1. Technical Field

This invention relates to a process for the formation of opaque images. More particularly this invention relates to a process for the formation of opaque images from toned photopolymer areas by leaching of monomer.

2. Background Art

Photopolymerizable systems are known to be useful for many purposes including printing, proofing, photoresists and for formation of shaped articles. In the field of proofing, known photopolymer systems can be either positive or negative working. Such proofs can be made that duplicate an original prior to printing and provide the printer with information desired to be able to reproduce the original. One such positive-working photopolymer system is described in Chu et al. U.S. Pat. No. 3,649,268. In this system a thin photopolymer layer on a support is laminated to a white paper substrate. The photopolymer layer is exposed through a negative or other image to actinic radiation, the exposed areas becoming hardened and the unexposed areas remaining tacky. The unexposed areas are then toned with a suitable toner which adheres to the tacky unexposed areas. This operation is generally repeated three more times using a different separation negative and toner with each additional laminate to form a duplicate copy of the original image. While forming good toned images, it is sometimes noted that the images are not as dense or as opaque as desired due to the fact that the toners tend to be transparent.

It is an object of this invention to form opaque images in the toned areas of a photopolymer layer. Another object is to provide the opaque images onto a variety of substrates.

DISCLOSURE OF THE INVENTION

In accordance with this invention there is provided a process for the formation of a white opaque image in the toned image areas of a layer of a photopolymer composition which comprises a leachable addition polymerizable ethylenically unsaturated compound, an initiator or initiator system, at least one organic polymeric binder, and optionally a plasticizer, said process comprising (1) treating the toned image areas with a solution capable of leaching the ethylenically unsaturated compound, (2) washing the treated areas, and (3) drying the treated and washed areas at a temperature up to 70° C.

The process of the invention is useful with photopolymerizable compositions which comprise at least one leachable addition polymerizable ethylenically unsaturated compound, a photopolymerization initiator or photopolymerization initiator system, at least one organic polymeric binder and optionally a plasticizer. Thermal polymerization inhibitors can also be present. The photopolymerizable compositions are present in the layer form on a removable or peelable support.

The term "leaching" as used herein imports removal of monomer by treatment with a solution. The term "leachable" means that residual unpolymerized monomer and plasticizer, if present, can be leached from polymerized monomer and an organic polymeric binder present in a photopolymerizable layer by means of a solution. The solution can permeate the photopolymerizable layer and dissolve or remove the unpolymerized monomer without substantially dissolving either polymerized monomer or binder. Similarly, the leachable monomer is an addition polymerizable ethylenically unsaturated compound and is in the solution in which the polymerized monomer and binder are significantly less soluble.

In an embodiment of this invention a receptor-supported layer of the above described photopolymerizable composition which has been imagewise exposed to an actinic radiation source and toned with suitable toners or pigments is treated with a solution capable of leaching the ethylenically unsaturated compound. The treatment which generally consists of soaking the layer but can include other known treatment methods normally lasts for a period of about 10 seconds to 3 minutes or more. The treated areas are then washed, e.g., with water for up to about 30 seconds or more, and then are dried, preferably with hot air using standard commercially available dryers or other drying means. The drying temperature normally does not exceed 70° C. An opaque white image is formed in the unexposed areas.

In other embodiments of the invention, the layer present on a temporary support is transferred to the receptor support at a temperature, e.g., 20° to 100° C., prior to or after toning the imagewise exposed layer. The toned areas (excess toner is removed) are then treated with a solution capable of leaching the ethylenically unsaturated compound, washed and dried as described above. In a particular embodiment wherein prior to exposure and formation of the toned areas in the photopolymerizable layer, the said layer which has a temporary support is laminated to the receptor surface as described above. The laminated layer is imagewise exposed through its temporary support, e.g., using an image-bearing transparency or other suitable phototool, and the laminate is peeled apart at an elevated temperature, e.g., 50° to 100° C., preferably using a drum transfer machine as described in U.S. Pat. No. 3,594,535, which is incorporated by reference, thereby yielding tonable and leachable areas in both the peeled portion of the photopolymer layer and the portion of the layer remaining on the receptor surface. Alternatively, the photopolymerizable layer after lamination and imagewise exposure can be peeled apart as described above and the peeled portion of the layer can be transferred to a receptor surface prior to or after toner is applied. The leaching, washing and drying steps are then accomplished as described above.

Solutions capable of leaching monomer and plasticizer, if present, include: mixtures of organic solvents or mixtures of water and organic solvents, e.g., methanol, ethanol, propanol; cyclohexane/alcohol/acetone, cyclohexane/methylene chloride or cyclohexane/trichloroethylene mixtures, etc.; water, and water/organic solvent mixtures, e.g., 1-propanol, methanol, ethanol, acetone, etc. Leaching can be optimized by adjusting the temperature and composition of the leaching solution as is known to one skilled in the art. After leaching the treated layers are washed and dried as described above.

Conventional milling, mixing of and solution techniques can be used in making the photopolymerizable compositions, the particular technique varying with the differences in properties of the respective components. The photopolymerizable elements useful in this invention are conveniently prepared by dissolving the components of the photopolymerizable layer in a volatile solvent such as acetone, trichloroethylene, or a low molecular weight alcohol; coating the solution on a temporary or peelable support, such as a plastic film or a paper by skim coating, doctor blade coating or other conventional coating technique; and allowing the solvent to evaporate. A protective cover sheet may then be applied to the surface of the photopolymerizable layer. Besides solvent casting the photopolymerizable layer may be prepared by any other conventional technique, for example, hot melt coating, hot pressing, calendering or extrusion onto the support. The binder is present in an amount from 30 to 70 percent by weight, and the monomer may comprise 70 to 30 percent by weight, both weights based on the total weight of the composition.

Suitable leachable ethylenically unsaturated compounds or monomers useful in the photopolymerizable compositions of the invention are free-radical initiated, chain propagating, addition polymerizable ethylenically unsaturated compounds which are substantially soluble in the above-described leaching solutions and which upon photoinitiated polymerization form polymers which are substantially insoluble in the solvent developer. The monomers contain one or more terminal ethylenic unsaturated groups, preferably two or more such terminal groups. Useful monomers include: trimethylolpropane triacrylate and trimethacrylate, triethylene glycol diacrylate and dimethacrylate, tetraethylene glycol diacrylate and dimethacrylate, polyoxyethylated trimethylolpropane triacrylate, etc.

At least one free-radical generating, addition polymerization initiator activatable by actinic radiation and thermally inactive at and below 85° C. is present in the photopolymerizable compositions of the invention in an amount of about 0.01 to 10% by weight of the weight of the composition. A photoinitiator system can also be used effectively. Suitable photoinitiators include: substituted or unsubstituted polynuclear quinones which are compounds having two intracyclic carbonyl groups attached to intracyclic carbon atoms in a conjugated carbocyclic ring system, e.g., 9,10-anthraquinone, 1-chloro-anthraquinone, 2-chloro-anthraquinone, 2-methyl-anthraquinone, 2-ethyl-anthraquinone, 2-tert-butylanthraquinone, octamethyl-anthraquinone, 1,4-napthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone 2,3-diphnylanthraquinone, sodium salt of anthraquinone, alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in U.S. Pat. No. 2,760,863, e.g., vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin. Particularly preferred photoinitiators are the 2,4,5-triphenylimidazolyl dimers disclosed in Chambers, U.S. Pat. No. 3,479,185. Also useful are the photoinitiating combinations disclosed in British Pat. No. 1,090,142, as well as the combinations of Michler's ketone with 2,4,5-triphenylimidazolyl dimers disclosed in Chang and Fan U.S. Pat. No. 3,549,367. Other useful initiators and initiator systems are disclosed in Fan, U.S. Pat. No. 3,558,322 and U.S. Pat. No. 3,661,588. All the above patents are incorporated by reference.

Polymeric binders useful in the photopolymerizable compositions, are film forming polymers which have number average molecular weights of at least about 10,000, preferably 30,000 and more. The number average molecular weights (Mn) of the polymers can be determined by gel permeation chromatography employing known polymeric standards, e.g., polybutadiene, polystyrene, etc. Combinations of binders can be present. The binders are substantially insoluble in the leaching solutions. Suitable binders include: poly(methylmethacrylate/methacrylic acid), polymethylmethacrylate, polyethylmethacrylate, polyvinyl esters, e.g., polyvinyl acetate/acrylate, polyvinyl acetate/methyl methacrylate, and mixtures thereof, etc.

In addition to the above-described components, a plasticizer is preferably present in the photopolymerizable composition. When present, the amount of plasticizer ranges from about 3 to 10% by weight of the potopolymerizable composition. Suitable plasticizers include: dialkyl phthalates, polyethylene glycol, alkyl phosphates, etc.

Useful thermal polymerization inhibitors include: p-methoxyphenol, hydroquinone, and alkyl and aryl-substituted hydroquinones and quinones, tert-butyl catechol, pyrogallol, copper resinate, naphthylamines, beta-naphthol, cuprous chloride. 2,6-di-tert-butyl p-cresol, phenothiazine, pyridine, nitrobenzene, dinitrobenzene, p-toluquinone and chloranil, etc.

As indicated above, the photopolymerizable compositions are initially applied to a temporary or peelable support. Such supports are generally plastic films or paper which may be treated in order to effect more efficient release from the photopolymerizable layer. Useful supports include: films composed of various film forming synthetic resins or high polymers, such as the addition polymers and, in particular, vinylidene chloride copolymers with vinyl chloride, vinyl acetate, styrene isobutylene and acrylonitrile; vinyl chloride homopolymers and copolymers with vinyl acetate, styrene isobutylene and acrylonitrile; linear condensation polymers such as polyesters, e.g., polyethylene terephthalate, polyamide, e.g., polyhexamethylenesebacamide; polyimides, e.g., films as disclosed in U.S. Pat. No. 3,179,634 which is incorporated by reference, e.g., polyhexamethylene-adipamide adipate and paper, etc.

Preferably, the elements useful in this invention have a protective cover sheet to prevent contamination of, or damage to the photopolymerizable layer during storage, manipulation, or exposure. When necessary the cover sheet may also act as an oxygen barrier improving exposure characteristics to actinic radiation. In general, the cover sheet is transparent to actinic radiation. The cover sheet may be a thin plastic film or sheet laminated to the surface of the photopolymerizable layer, e.g., polystyrene, polyethylene, polypropylene, polyethylene terephthalate, etc. A preferred removable cover sheet is polyethylene terephthalate film having a silicone release layer coated thereon. The cover sheet, if present, is removed after imagewise exposure or prior to transfer to a receptor surface depending on the particular use for the photopolymerizable element.

The receptor surface to which the photopolymer layer is transferred or laminated prior to or after exposure and before or after toning is an inert surface, preferably metal, e.g., aluminum which can be anodized, other metals, plastic films, paper, etc.

Since free-radical generating, addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs are customarily used at a distance of 1 to 20 inches (2.54 to 50.8 cm) from the photopolymerizable layer. It is noted, however, that in certain circumstances it may be advantageous to expose with visible light, using a photoinitiator sensitive in the visible region of the spectrum, e.g., 9,10-phenanthrenequinone or a combination of a sensitizing dye such as methylene blue with an initiator. In such cases, the radiation source should furnish an effective amount of visible radiation. Many of the radiation sources listed above furnish the required amount of visible light.

BEST MODE FOR CARRYING OUT THE INVENTION

The best mode is illustrated in Example 1.

INDUSTRIAL APPLICABILITY

The process of this invention provides a method involving leaching of monomer in a photopolymerizable layer for obtaining direct positive images for microfilm or other applications similar to those obtained by vesicular processes. Many variations are possible including thermal transfer to a sustrate prior to or after toning. Excellent opaque images are obtained which are white in color. The images are extremely durable. The process is also useful in the preparation of overlay exhibits which contain opaque white as well as colored images. Even though the images may be toned originally with toners which are transparent the images can be rendered opaque by the process of the invention.

EXAMPLES

The following examples illustrate the invention wherein the parts and percentages are by weight. The molecular weights for the polymers are number average molecular weights.

EXAMPLE 1

A photopolymer composition is prepared from the following ingredients:

| Ingredient | Amount (g) |
|---|---|
| Methylmethacrylate/methacrylic acid copolymer containing 10 mole % acid groups, molecular weight 30,000 | 9.00 |
| Trimethylolpropane trimethacrylate, molecular weight 1,000 | 8.69 |
| Polyoxyethylene lauryl ether, molecular weight 362 | 1.58 |
| 2-o-Chlorophenyl-4,5-bis(m-methoxyphenyl) imidazolyl dimer | 0.318 |
| 2-Mercaptobenzothiazole | 0.182 |
| 2-(Stilby-4″)-(naphtho-1′,2′,:4,5)-1,2,3-triazole-2″-sulfonic acid | 0.212 |

| Ingredient | Amount (g) |
|---|---|
| phenyl ester | |

Methylene chloride is added to bring the total weight to 160.0 g.

The composition is coated on a resin subbed polyethylene terephthalate film support using a 0.005 inch (0.127 mm) coating knife and is dried at normal room temperature to produce a dry layer having a coating weight of 139.2 mg/dm$^2$. Onto the dry layer is laminated as a cover sheet a polyethylene terephthalate film having a silicone release layer coated thereon.

The photopolymer element is exposed at a distance of 101.6 cm with a 1000 watt Quartz iodine lamp for 2 minutes through the cover sheet and an image bearing transparency placed thereon. The protective cover sheet is removed, and the surface is toned with a magenta toner, C.I. Pigment Red 122. The excess toner is removed by wiping with a cotton cloth, so that only the unexposed areas have toner adhering to the surface.

A solution is prepared as follows:

| | |
|---|---|
| 1-Propanol | 30 ml |
| Acetone | 30 ml |
| Distilled water | 30 ml |

One-half of the exposed and toned film as described above is soaked in the above-described solution for 1 minute. The soaked film is washed in water for 30 seconds and then is dried with a hot air blower. An opaque white image is formed in the unexposed areas which have been soaked in the above-described solution. Similar results are achieved when the magenta toner is replaced by one of the following toners:

yellow toner: C.I. Pigment Yellow 34
cyan toner: C.I. Pigment Blue 15
black toner: C.I. Pigment Black 7

EXAMPLE 2

Example 1 is repeated except that in one element a photopolymer composition is used in which a polymethylmethacrylate binder is present and in another element the polymeric binder is a 50/50 mixture of methylmethacrylate/methacrylic acid copolymer containing 10% acid groups and polymethylmethacrylate polymer having a molecular weight of 600,000. Opaque white images are formed in the unexposed areas similar to that obtained in Example 1.

EXAMPLE 3

Example 1 is repeated except that two soaking solutions containing the following ingredients are used:

| | | |
|---|---|---|
| A. | 1-Propanol | 20 ml |
| | Acetone | 40 ml |
| | Distilled water | 30 ml |
| B. | Methanol | 20 ml |
| | Acetone | 20 ml |
| | Distilled water | 20 ml |

The results are similar to that obtained in Example 1.

EXAMPLE 4

Example 1 is repeated except that a 0.010 (0.254 mm) coating knife is used to produce a dry layer having a coating weight of 324.5 mg/dm². The magenta-toned image prior to treatment in the described solution is transferred to an anodized aluminum sheet at a temperature of 100° C. using a drum transfer machine as described in U.S. Pat. No. 3,594,535. After soaking the transferred image in the solution, washing in water and drying as described in Example 1, a white opaque image similar to that of Example 1 is achieved. The above-described procedure is repeated except that the magenta toner is replaced by a cyan toner as described in Example 1. A similar white opaque image is achieved.

EXAMPLE 5

Example 4 is repeated except that the image is transferred to the anodized aluminum sheet prior to toning the unexposed areas with the magenta toner. A similar white opaque image is obtained after the soaking, water washing and drying steps as described in Example 1.

EXAMPLE 6

A photopolymerizable element is prepared as described in Example 1 and is laminated directly to an aluminum sheet at 100° C. without use of a polyethylene terephthalate cover sheet. The photopolymer layer is imagewise exposed as described in Example 1 an then is peeled apart at 100° C. on the drum transfer machine described in Example 4. Magenta toner described in Example 1 is applied to the photopolymer image remaining on the aluminum surface. Cyan toner described in Example 1 is applied to the photopolymer image on the surface of the transfer drum. Each toned image is soaked, water washed and dried as described in Example 1 with both images becoming white opaque.

EXAMPLE 7

A photopolymerizable element is prepared as described in Example 1 without use of a cover sheet. Magenta toner as described in Example 1 is applied to the unexposed photopolymer surface. The toned element is then laminated to an anodized aluminum surface at 100° C. The laminated element is then imagewise exposed as described in Example 1. The exposed laminated element is peeled apart as described in Example 6 leaving a portion of the image on the aluminum and another portion on the support. Both images are soaked, water washed and dried as described in Example 1 with both images becoming white opaque.

EXAMPLE 8

A photopolymer composition is prepared from the following ingredients:

| Ingredient | Amount (g) |
| --- | --- |
| Methylmethacrylate/methacrylic acid polymer containing 10 mole % acid groups, molecular weight 30,000 | 38.34 |
| Trimethylolpropane triacrylate, | 45.20 |
| Polyoxyethylene laurylether | 3.99 |
| 2-o-Chlorophenyl-4,5-bis(m-methoxyphenyl) imidazolyl dimer | 5.57 |
| 2-Mercaptobenzothiazole | 3.17 |
| 2-(Stilby-4″)-(naphtho-1′,2′:4,5)-1,2,3-triazole-2″-sulfonic acid phenyl ester | 3.73 |

Methylene chloride is added to bring the total weight to 800.0 g.

The composition is coated on a resin subbed polyethylene terephthalate film support using a 0.005 inch (0.127 mm) coating knife and is dried at normal room temperature to produce a dry layer having a coating weight of 139.2 mg/dm². Onto the dry layer is laminated as a cover sheet a polyethylene terephthalate film having a silicone release layer coated thereon.

The photopolymer element is exposed at a distance of 101.6 cm with a 1000 watt Quartz iodine lamp for 40 seconds through the cover sheet and an image bearing transparency placed thereon. The protective cover sheet is removed, and the surface is toned with a magenta toner, C.I. Pigment Red 122. The excess toner is removed by wiping with a cotton cloth, so that only the unexposed areas have toner adhering to the surface.

A solution is prepared as follows:

| | |
| --- | --- |
| Cyclohexane | 40 cc |
| Acetone | 25 cc |
| Methanol | 35 cc |

One-half of the exposed and toned film as described above is soaked in the above-described solution for 40 seconds. The soaked film is washed in water for 10 seconds and then is dried with a hot air blower. An opaque white image is formed in the unexposed areas which have been soaked in the above-described solution.

I claim:

1. Process for the formation of a white opaque image in the toned image areas of an imagewise exposed layer of a photopolymer composition which comprises a leachable addition polymerizable ethylenically unsaturated compound, an initiator or initiator system, at least one organic polymeric binder and optionally a plasticizer, said process comprising
   (1) treating the toned image areas with a solution capable of leaching the ethylenically unsaturated compound,
   (2) washing the treated areas, and
   (3) drying the treated and washed areas at a temperature up to 70° C.

2. A process according to claim 1 wherein prior to formation of the toned areas in the layer and treated with the solution, the layer is transferred to a receptor surface.

3. A process according to claim 1 wherein the toned photopolymer layer prior to treatment with the solution is transferred to a receptor surface.

4. A process according to claim 1 wherein prior to formation of the toned areas in the layer and treatment with the solution, the photopolymer layer is laminated to a receptor surface, the photopolymer is imagewise exposed through an image-bearing transparency and is peeled apart at an elevated temperature yielding tonable and leachable areas in both the peeled portion of the layer and the portion of the layer remaining on the receptor surface.

5. A process according to claim 4 wherein after the photopolymer layer is peeled apart the peeled portion of the layer is transferred to a receptor surface prior to toning and treatment with the solution.

6. A process according to claim 4 wherein after toning but prior to treating with the leaching solution the peeled portion of the layer is transferred to a receptor surface.

7. A process according to claim 1 wherein the leaching solution consists essentially of alcohol, acetone and water.

8. A process according to claim 1 wherein the leaching solution consists essentially of cyclohexane, alcohol and acetone.

9. A process according to claim 1 wherein the treated areas are washed with water.

* * * * *

UNITED STATES PATENT AND TRADEMARK OFFICE
CERTIFICATE OF CORRECTION

PATENT NO. : 4,454,217
DATED : June 12, 1984
INVENTOR(S) : Victor F. Chu

It is certified that error appears in the above-identified patent and that said Letters Patent is hereby corrected as shown below:

On the title page add Item /73/:

— /73/ Assignee: E. I. du Pont de Nemours & Co., Wilmington, Del. —

Column 8, line 38, "treated" should read — treatment —.

Signed and Sealed this

Sixteenth Day of April 1985

[SEAL]

Attest:

DONALD J. QUIGG

Attesting Officer    Acting Commissioner of Patents and Trademarks